US010229227B2

(12) United States Patent
Wright et al.

(10) Patent No.: US 10,229,227 B2
(45) Date of Patent: Mar. 12, 2019

(54) DESIGN-MODEL MANAGEMENT USING A GEOMETRIC CRITERION

(71) Applicant: MITEK HOLDINGS, INC., Wilmington, DE (US)

(72) Inventors: William A. Wright, Lexington, MA (US); Michael G. Shnitman, Newton, MA (US)

(73) Assignee: MITEK HOLDINGS, INC., Wilmington, DE (US)

( * ) Notice: Subject to any disclaimer, the term of this patent is extended or adjusted under 35 U.S.C. 154(b) by 258 days.

(21) Appl. No.: 15/219,417

(22) Filed: Jul. 26, 2016

(65) Prior Publication Data
US 2018/0032646 A1 Feb. 1, 2018

(51) Int. Cl.
*G06F 17/50* (2006.01)
*G06T 17/10* (2006.01)

(52) U.S. Cl.
CPC .......... G06F 17/5004 (2013.01); G06T 17/10 (2013.01); *G06T 2210/04* (2013.01)

(58) Field of Classification Search
CPC .. G06F 17/5004; G06T 17/10; G06T 2210/04
USPC .......................................................... 703/1
See application file for complete search history.

(56) References Cited

U.S. PATENT DOCUMENTS

| 6,766,304 | B2 | 7/2004 | Kemp, II et al. |
| 6,772,132 | B1 | 8/2004 | Kemp, II et al. |
| 7,072,727 | B1 | 7/2006 | Davis |
| 7,499,839 | B2 | 3/2009 | Massaro et al. |
| 2001/0037190 | A1 | 11/2001 | Jung |
| 2004/0239494 | A1 | 12/2004 | Kennedy |
| 2006/0008119 | A1 | 1/2006 | Chang |
| 2007/0219764 | A1 | 9/2007 | Backe et al. |
| 2008/0120068 | A1 | 5/2008 | Martin et al. |
| 2008/0120069 | A1 | 5/2008 | Martin |
| 2009/0271154 | A1 | 10/2009 | Coad et al. |
| 2011/0153524 | A1 | 6/2011 | Schnackel |
| 2011/0218777 | A1 | 9/2011 | Chen |

(Continued)

OTHER PUBLICATIONS

Andrew J. Marsh, "Thermal modeling: The ECOTECT Way" Natural frequency, ISSN: 1833-7570 Issue No. 0002, Aug. 1, 2006; 17 pages.*

(Continued)

*Primary Examiner* — Dwin M Craig
(74) *Attorney, Agent, or Firm* — Stinson Leonard Street LLP

(57) ABSTRACT

Disclosed aspects relate to managing a group of geometric objects. The group of geometric objects are correlated to a set of spatial zones associated with an architectural layout. A first geometric object of the group of geometric objects is detected. The first geometric object has a first geometric object size value. By comparing the first geometric object size value with a threshold geometric object size value, it is determined to convert the first geometric object. Based on proximity, a group of conversion candidates is identified from the group of geometric objects. Based on the first geometric object and the group of conversion candidates, a second geometric object is determined using a geometric criterion. Using the second geometric object, a design-model of the architectural layout is established.

19 Claims, 10 Drawing Sheets

(56) References Cited

U.S. PATENT DOCUMENTS

| | | |
|---|---|---|
| 2012/0072181 A1 | 3/2012 | Imani |
| 2012/0110595 A1 | 5/2012 | Reitman |
| 2013/0066473 A1 | 3/2013 | Smith et al. |
| 2013/0151013 A1* | 6/2013 | Nikovski ................ F24F 11/30 700/276 |
| 2013/0261833 A1* | 10/2013 | Meghani ................ G06Q 50/06 700/297 |
| 2014/0039844 A1 | 2/2014 | Strelec et al. |
| 2014/0039845 A1 | 2/2014 | K M et al. |
| 2015/0347671 A1 | 12/2015 | Kiff |

OTHER PUBLICATIONS

Robina Hetherington, Robin Laney, Stephen Peake; "Zone Modelling and Visualization: Keys to the Design of Low Crabon Buildings" May 1, 2012, 9 pages.*
Roche, James, How to Read a Floor Plan, Time to Build, <http://blog.houseplans.com/article/how-to-read-a-floor-plan>.
List of Wrightsoft Patents or Patent Applications Treated as Related.
Charles S. Barnaby, Mikhail Shnitman, William A. Wright, "HVAC System Design Automation: Issues, Methods, and Ultimate Limits" Seventh International IBPSA Conference, Aug. 13-15, 2001, pp. 1151-1158.
User Manual IDA Indoor Climate and Energy, Versions 4.5 EQUA Simulation AB, Feb. 2013, pp. 1-179.
E. Subrahmanian; S. Rachuri; S. Fenves; R. Sriram; "Product lifecycle management support: A challenge in supporting product design and manufacturing in a networked economy" NIST National Institute of Standards and Technology, NISTIR 7211, Mar. 2005, 23 pages.

* cited by examiner

800

900

1000

DESIGN-MODEL MANAGEMENT USING A GEOMETRIC CRITERION

BACKGROUND

This disclosure relates generally to computer systems and, more particularly, relates to management of data associated with an architectural layout. The amount of data that needs to be managed by enterprises is increasing. Management of data associated with architectural layouts may be desired to be performed as efficiently as possible. As data needing to be managed increases, the need for management efficiency may increase.

SUMMARY

Aspects of the disclosure merge elements of an architectural layout to establish a design-model of the architectural layout. An element may include a geometric object or a spatial zone. When the element is below a threshold size, usefulness of the design-model may be positively impacted by combining the element with another element. Accordingly, elements may be transformed from the architectural layout to the design-model in a manner which provides performance or efficiency benefits with respect to the design-model or its implementation. For instance, an example architectural layout can have an entryway element, a closet element, and a stairwell element which may be merged into one element for a heating, ventilation, and air conditioning (HVAC) design-model.

Aspects of the disclosure relate to managing a group of geometric objects. The group of geometric objects are correlated to a set of spatial zones associated with an architectural layout. A first geometric object of the group of geometric objects is detected. The first geometric object has a first geometric object size value. By comparing the first geometric object size value with a threshold geometric object size value, it is determined to convert the first geometric object. Based on proximity, a group of conversion candidates is identified from the group of geometric objects. Based on the first geometric object and the group of conversion candidates, a second geometric object is determined using a geometric criterion. Using the second geometric object, a design-model of the architectural layout is established.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
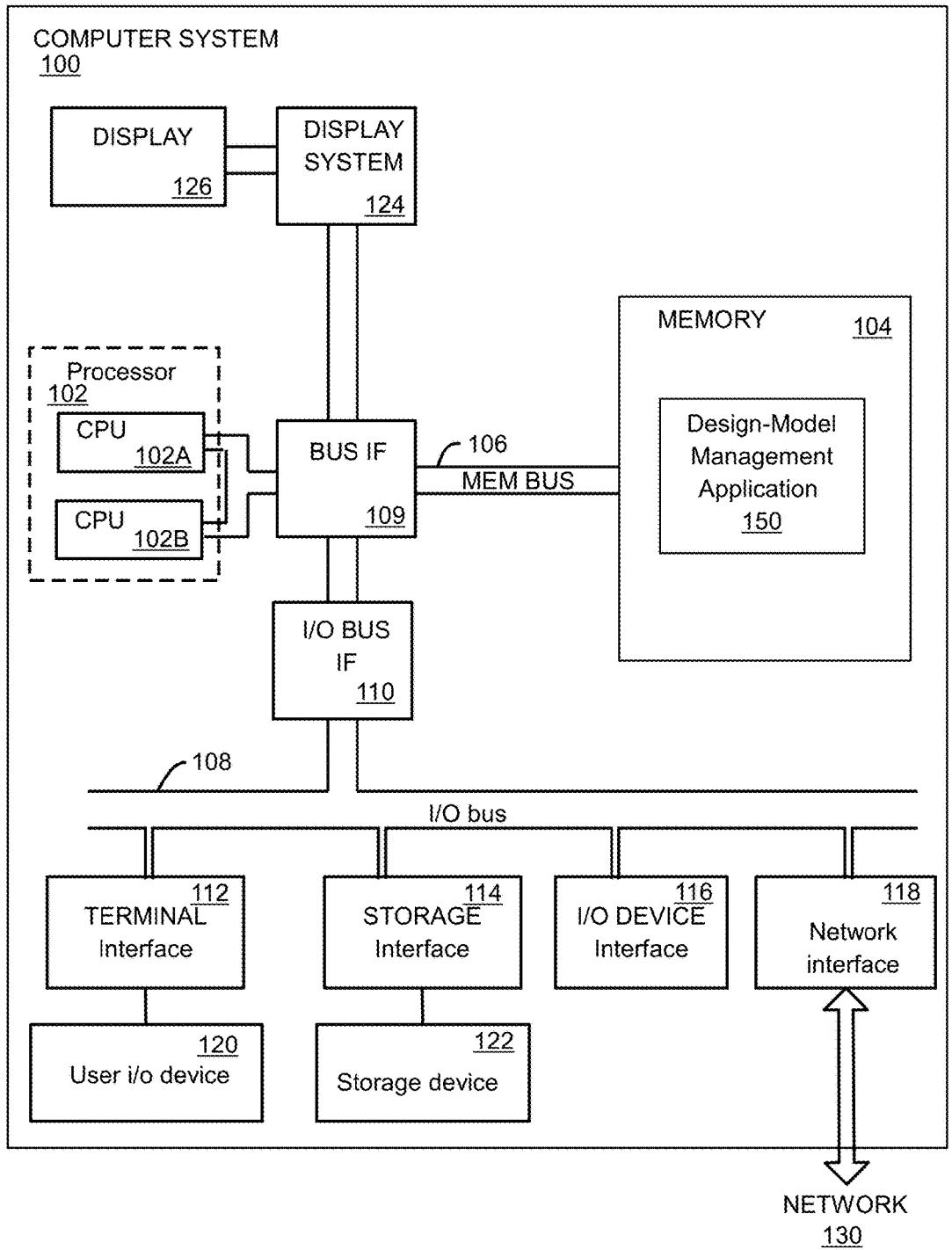
FIG. 1 depicts a high-level block diagram of a computer system for implementing various embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the disclosure merge elements of an architectural layout to establish a design-model of the architectural layout. An element may include a geometric object (e.g., polytope) or a spatial zone (e.g., which represents a room of a building). When the element is below a threshold size, usefulness of the design-model may be positively impacted by combining the element with another element. Accordingly, elements may be transformed from the architectural layout to the design-model in a manner which provides performance or efficiency benefits with respect to the design-model or its implementation. For instance, an example architectural layout can have an entryway element, a closet element, and a stairwell element which may be merged into one element for a heating, ventilation, and air conditioning (HVAC) design-model.

In certain embodiments, aspects can divide an element of the architectural layout to establish the design-model of the architectural layout. As such merging or dividing element(s) may be termed a conversion. A determination to perform the conversion may be made based on a threshold element size. The conversion may use one or more criteria to determine a new element. For example, the criteria can be configured or arranged to be consistent with energy distribution efficiency for the design-model.

Aspects of the disclosure include a method, system, and computer program product for managing a group of geometric objects. The group of geometric objects are correlated to a set of spatial zones associated with an architectural layout. A first geometric object of the group of geometric objects is detected. The first geometric object has a first geometric object size value. By comparing the first geometric object size value with a threshold geometric object size value, it is determined to convert (e.g., merge, divide) the first geometric object. Based on proximity (e.g., adjoining, neighboring), a group of conversion candidates is identified from the group of geometric objects. Based on the first geometric object and the group of conversion candidates, a second geometric object is determined using a geometric criterion. Using the second geometric object, a design-model of the architectural layout is established.

In embodiments, the geometric criterion uses/includes a simple shape factor (e.g., preferring simple geometric shapes instead of more complex geometric shapes). In embodiments, the geometric criterion uses/includes a vertices factor (e.g., with respect to vertices of the second geometric object). In embodiments, determining the second geometric object using the geometric criterion includes a set of operations. For example, a first operation may compute a first vertex quantity for a first proposed geometric object combination. A second operation may compute a second vertex quantity for a second proposed geometric object combination. A third operation can compare the first vertex quantity and the second vertex quantity. As a fourth operation, one of the proposed geometric object combinations may be selected based on the comparison.

Aspects of the disclosure include a method, system, and computer program product for managing a set of spatial zones associated with an architectural layout. A first spatial zone of the set of spatial zones is detected. The first spatial zone has a first spatial zone size value. By comparing the first spatial zone size value with a threshold spatial zone size value, it is determined to convert (e.g., merge, divide) the first spatial zone. Based on proximity (e.g., adjoining, neighboring), a group of conversion candidates is identified from the set of spatial zones. Based on the first spatial zone and the group of conversion candidates, a second spatial zone is determined using an architectural criterion. Using the second spatial zone, a design-model of the architectural layout is established.

In embodiments, the architectural criterion uses/includes at least one of a room-type factor, an elevation factor, a closet factor, a doorway factor, a stairwell factor, or a window factor. In embodiments, the architectural criterion includes a user-defined factor which impacts an energy distribution efficiency (e.g., air/radiant/hydronic distribution of energy/power to satisfy a thermal load). In embodiments, determining the second spatial zone using the architectural criterion includes a set of operations. For example, a first operation may compute a first energy distribution efficiency for a first proposed spatial zone combination. A second operation may compute a second energy distribution efficiency for a second proposed spatial zone combination. A third operation can compare the first energy distribution efficiency with the second energy distribution efficiency. As a fourth operation, one of the proposed spatial zone combinations may be selected based on the comparison.

In various embodiments, the design-model includes a heating, ventilation, and air conditioning (HVAC) design-model. Aspects of the disclosure can include performance or efficiency benefits (e.g., speed, flexibility, responsiveness, resource usage) for managing geometric objects or spatial zones associated with an architectural layout. For example, resources such as bandwidth, processing, or memory may be saved.

Turning now to the figures, FIG. 1 depicts a high-level block diagram of a computer system for implementing various embodiments of the present disclosure, consistent with various embodiments. The mechanisms and apparatus of the various embodiments disclosed herein apply equally to any appropriate computing system. The major components of the computer system 100 include one or more processors 102, a memory 104, a terminal interface 112, a storage interface 114, an I/O (Input/Output) device interface 116, and a network interface 118, all of which are communicatively coupled, directly or indirectly, for inter-component communication via a memory bus 106, an I/O bus 108, bus interface unit 109, and an I/O bus interface unit 110.

The computer system 100 may contain one or more general-purpose programmable central processing units (CPUs) 102A and 102B, herein generically referred to as the processor 102. In embodiments, the computer system 500 may contain multiple processors; however, in certain embodiments, the computer system 100 may alternatively be a single CPU system. Each processor 102 executes instructions stored in the memory 104 and may include one or more levels of on-board cache.

In embodiments, the memory 104 may include a random-access semiconductor memory, storage device, or storage medium (either volatile or non-volatile) for storing or encoding data and programs. In certain embodiments, the memory 104 represents the entire virtual memory of the computer system 100, and may also include the virtual memory of other computer systems coupled to the computer system 100 or connected via a network. The memory 104 can be conceptually viewed as a single monolithic entity, but in other embodiments the memory 104 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The memory 104 may store all or a portion of the various programs, modules and data structures for processing data transfers as discussed herein. For instance, the memory 104 can store a design-model management application 150. In embodiments, the design-model management application 150 may include instructions or statements that execute on the processor 102 or instructions or statements that are interpreted by instructions or statements that execute on the processor 102 to carry out the functions as further described below. In certain embodiments, the design-model management application 150 is implemented in hardware via semiconductor devices, chips, logical gates, circuits, circuit cards, and/or other physical hardware devices in lieu of, or in addition to, a processor-based system. In embodiments, the design-model management application 150 may include data in addition to instructions or statements.

The computer system 100 may include a bus interface unit 109 to handle communications among the processor 102, the memory 104, a display system 124, and the I/O bus interface unit 110. The I/O bus interface unit 110 may be coupled with the I/O bus 108 for transferring data to and from the various I/O units. The I/O bus interface unit 110 communicates with multiple I/O interface units 112, 114, 116, and 118, which are also known as I/O processors (IOPs) or I/O adapters (IOAs), through the I/O bus 108. The display system 124 may include a display controller, a display memory, or both. The display controller may provide video, audio, or both types of data to a display device 126. The display memory may be a dedicated memory for buffering video data. The display system 124 may be coupled with a display device 126, such as a standalone display screen, computer monitor, television, or a tablet or handheld device display. In one embodiment, the display device 126 may include one or more speakers for rendering audio. Alternatively, one or more speakers for rendering audio may be coupled with an I/O interface unit. In alternate embodiments, one or more of the functions provided by the display system 124 may be on board an integrated circuit that also includes the processor 102. In addition, one or more of the functions provided by the bus interface unit 109 may be on board an integrated circuit that also includes the processor 102.

The I/O interface units support communication with a variety of storage and I/O devices. For example, the terminal interface unit 112 supports the attachment of one or more user I/O devices 120, which may include user output devices (such as a video display device, speaker, and/or television set) and user input devices (such as a keyboard, mouse, keypad, touchpad, trackball, buttons, light pen, or other pointing device). A user may manipulate the user input devices using a user interface, in order to provide input data and commands to the user I/O device 120 and the computer system 100, and may receive output data via the user output devices. For example, a user interface may be presented via the user I/O device 120, such as displayed on a display device, played via a speaker, or printed via a printer.

The storage interface 114 supports the attachment of one or more disk drives or direct access storage devices 122 (which are typically rotating magnetic disk drive storage devices, although they could alternatively be other storage devices, including arrays of disk drives configured to appear as a single large storage device to a host computer, or solid-state drives, such as flash memory). In some embodiments, the storage device 122 may be implemented via any type of secondary storage device. The contents of the memory 104, or any portion thereof, may be stored to and retrieved from the storage device 122 as needed. The I/O device interface 116 provides an interface to any of various other I/O devices or devices of other types, such as printers or fax machines. The network interface 118 provides one or more communication paths from the computer system 100 to other digital devices and computer systems; these communication paths may include, e.g., one or more networks 130.

Although the computer system 100 shown in FIG. 1 illustrates a particular bus structure providing a direct communication path among the processors 102, the memory 104, the bus interface 109, the display system 124, and the I/O bus interface unit 110, in alternative embodiments the computer system 100 may include different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface unit 110 and the I/O bus 108 are shown as single respective units, the computer system 100 may, in fact, contain multiple I/O bus interface units 110 and/or multiple I/O buses 108. While multiple I/O interface units are shown, which separate the I/O bus 108 from various communications paths running to the various I/O devices, in other embodiments, some or all of the I/O devices are connected directly to one or more system I/O buses.

In various embodiments, the computer system 100 is a multi-user mainframe computer system, a single-user system, or a server computer or similar device that has little or no direct user interface, but receives requests from other computer systems (clients). In other embodiments, the computer system 100 may be implemented as a desktop computer, portable computer, laptop or notebook computer, tablet computer, pocket computer, telephone, smart phone, or any other suitable type of electronic device.

FIG. 1 depicts several major components of the computer system 100. Individual components, however, may have greater complexity than represented in FIG. 1, components other than or in addition to those shown in FIG. 1 may be present, and the number, type, and configuration of such components may vary. Several particular examples of additional complexity or additional variations are disclosed herein; these are by way of example only and are not necessarily the only such variations. The various program components illustrated in FIG. 1 may be implemented, in various embodiments, in a number of different manners, including using various computer applications, routines, components, programs, objects, modules, data structures, etc., which may be referred to herein as "software," "computer programs," or simply "programs."

Figure 2:
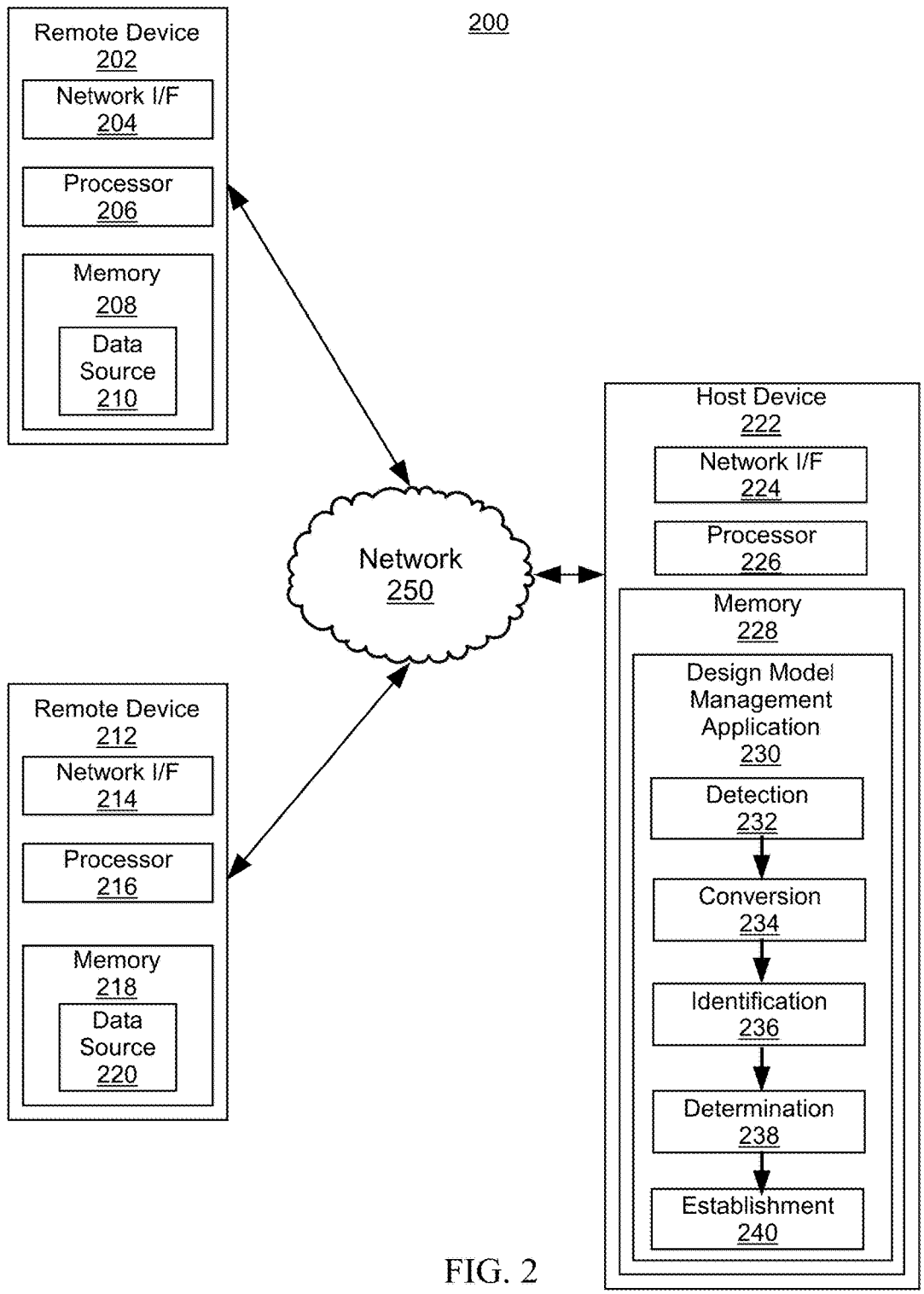
FIG. 2 is a diagrammatic illustration of an example computing environment according to embodiments.

FIG. 2 is a diagrammatic illustration of an example computing environment 200, consistent with embodiments of the present disclosure. In certain embodiments, the environment 200 can include one or more remote devices 202, 212 and one or more host devices 222. Remote devices 202, 212 and host device 222 may be distant from each other and communicate over a network 250 in which the host device 222 comprises a central hub from which remote devices 202, 212 can establish a communication connection. Alternatively, the host device and remote devices may be configured in any other suitable relationship (e.g., in a peer-to-peer or other relationship).

In certain embodiments the network 250 can be implemented by any number of any suitable communications media (e.g., wide area network (WAN), local area network (LAN), Internet, Intranet, etc.). Alternatively, remote devices 202, 212 and host devices 222 may be local to each other, and communicate via any appropriate local communication medium (e.g., local area network (LAN), hardwire, wireless link, Intranet, etc.). In certain embodiments, the network 250 can be implemented within a cloud computing environment, or using one or more cloud computing services. Consistent with various embodiments, a cloud computing environment can include a network-based, distributed data processing system that provides one or more cloud computing services. In certain embodiments, a cloud computing environment can include many computers, hundreds or thousands of them, disposed within one or more data centers and configured to share resources over the network.

Consistent with various embodiments, host device 222 and remote devices 202, 212 may be computer systems preferably equipped with a display or monitor. In certain embodiments, the computer systems may include at least one processor 206, 216, 226 memories 208, 218, 228 and/or internal or external network interface or communications devices 204, 214, 224 (e.g., modem, network cards, etc.), optional input devices (e.g., a keyboard, mouse, or other input device), and other commercially available and custom software (e.g., browser software, communications software, server software, natural language processing software, search engine and/or web crawling software, filter modules for filtering content based upon predefined criteria, etc.). In certain embodiments, the computer systems may include server, desktop, laptop, and hand-held devices.

In certain embodiments, remote devices 202, 212 may include a data source 210, 220. The data source 210, 220 may be a database, corpus, or other data storage system configured to communicate with the host device 222. The data source 210 may be configured to provide data/information (e.g., a set of architectural objects, architectural layout, building blueprints, PDF files, ACA files, structural photos) to the host device 222 for processing. As described herein, a design-model management application 230 of the host device 222 may be configured to manage (a group of geometric objects correlated to) a set of spatial zones associated with an architectural layout.

The design-model management application 230 may use data/information from one or more data sources such as data source 210 or data source 220. For example, an input having an array of relatively small-sized polytopes/rooms can merge at least a portion of the array to generate a regular-sized polytope/room. As such, aspects can establish a design-model that efficiently manages energy distribution, for instance. The design-model management application 230 may have a set of operations. The set of operations can include a detection operation 232, a conversion operation 234, an identification operation 236, a determination operation 238, or an establishment operation 240.

In embodiments, the detection operation 232 detects (e.g., senses, receives) a first geometric object of a group of geometric objects. The first geometric object has a first geometric object size value. For example, a first rectangle of a group of polygons may have a size value (e.g., area=200). In embodiments, the detection operation 232 detects a first spatial zone of a set of spatial zones. The first spatial zone has a first spatial zone size value. For example, a first entryway of a set of rooms may have a size value (e.g., volume=450). The size value may be one or more of various (multi-dimensional) measurements such as perimeter, area, volume, load capability configuration, longest-side-length, neighboring side ratio, etc.

In embodiments, the conversion operation 234 compares the first geometric object size value with a threshold geometric object size value and determines to convert (e.g., merge, divide) the first geometric object. For example, a merge operation (e.g., of the first geometric object with another geometric object) may be initiated if the first geometric object size value (e.g., area=200) is less than the threshold geometric object size value (e.g., area=350). In embodiments, the conversion operation 234 compares the first spatial zone size value with a threshold spatial zone size value and determines to convert (e.g., merge, divide) the first spatial zone. For example, a merge operation (e.g., of the first spatial zone with another spatial zone) may be initiated if the first spatial zone size value (e.g., volume=450) is less than the threshold spatial zone size value (e.g., volume=500). As another example, a divide operation (e.g., of the first spatial zone into multiple spatial zones) may be initiated if the first spatial zone size value (e.g., neighboring side ratio=30:12) is greater than the threshold spatial zone size value (e.g., neighboring side ratio=2:1).

In embodiments, the identification operation 236 identifies a group of conversion candidates (e.g., merge/division candidates) of the group of geometric objects (e.g., in response to determining to convert the first geometric object). The identification may be based on proximity (e.g., adjoining, neighboring) with respect to the first geometric object (or another conversion candidate). For example, a group of merge candidates may include polytopes below a threshold size which adjoin a first geometric object. In embodiments, the identification operation 236 identifies a group of conversion candidates (e.g., merge/division candidates) of the set of spatial zones. The identification may be based on proximity (e.g., adjoining, neighboring) with respect to the first spatial zone (or another conversion candidate). For example, a group of merge candidates may include rooms below a threshold size which neighbor the first spatial zone. In certain embodiments, a candidate size value of a particular conversion candidate may be utilized by the identification operation 236 (e.g., based on a user-defined preference of merging/dividing with larger/smaller conversion candidates).

In embodiments, the determination operation 238 determines a second geometric object using a geometric criterion. The determination is made based on the first geometric object and the group of conversion candidates. For example, the first geometric object is combined with a portion of the group of conversion candidates which will result in a simple geometric shape (e.g., fewest number of vertices) as the second geometric object. In embodiments, the determination operation 238 determines a second spatial zone using an architectural criterion. The determination is made based on the first spatial zone and the group of conversion candidates. For example, the first spatial zone is combined with a portion of the group of conversion candidates which result in a positive impact on energy distribution to form the second spatial zone (e.g., merge a small hallway with an entryway and multiple separate closets).

In embodiments, the establishment operation 240 establishes a design-model of the architectural layout using the second geometric object. For example, the design-model may include a created polytope (e.g., which previously was a plurality of polytopes) which is generated in response to determining the second geometric object. In embodiments, the establishment operation 240 establishes a design-model of the architectural layout using the second spatial zone. For example, the design-model may include a created room (e.g., which previously was a plurality of rooms/architectural-spaces) which is generated in response to determining the second spatial zone. The design-model can include a virtual model. In certain embodiments, the design-model includes a heating, ventilation, and air conditioning (HVAC) design-model for an HVAC system proposed to be constructed in the building.

In embodiments, the operational steps such as the detection, the conversion, the identification, the determination, and the establishment each occur in an automated fashion without user intervention or manual action (e.g., using automated computing machinery, fully machine-driven without manual stimuli). The automated operational steps may be performed by a design-model management engine (e.g., as part of an HVAC design management system). Altogether, aspects of the design-model management application 230 can include performance or efficiency benefits (e.g., speed for task completion, flexibility with respect to receiving various types of data/information, responsiveness of design-model production, resource usage to limit burdensome activities) for managing (a group of geometric objects correlated to) a set of spatial zones associated with an architectural layout.

Figure 3:
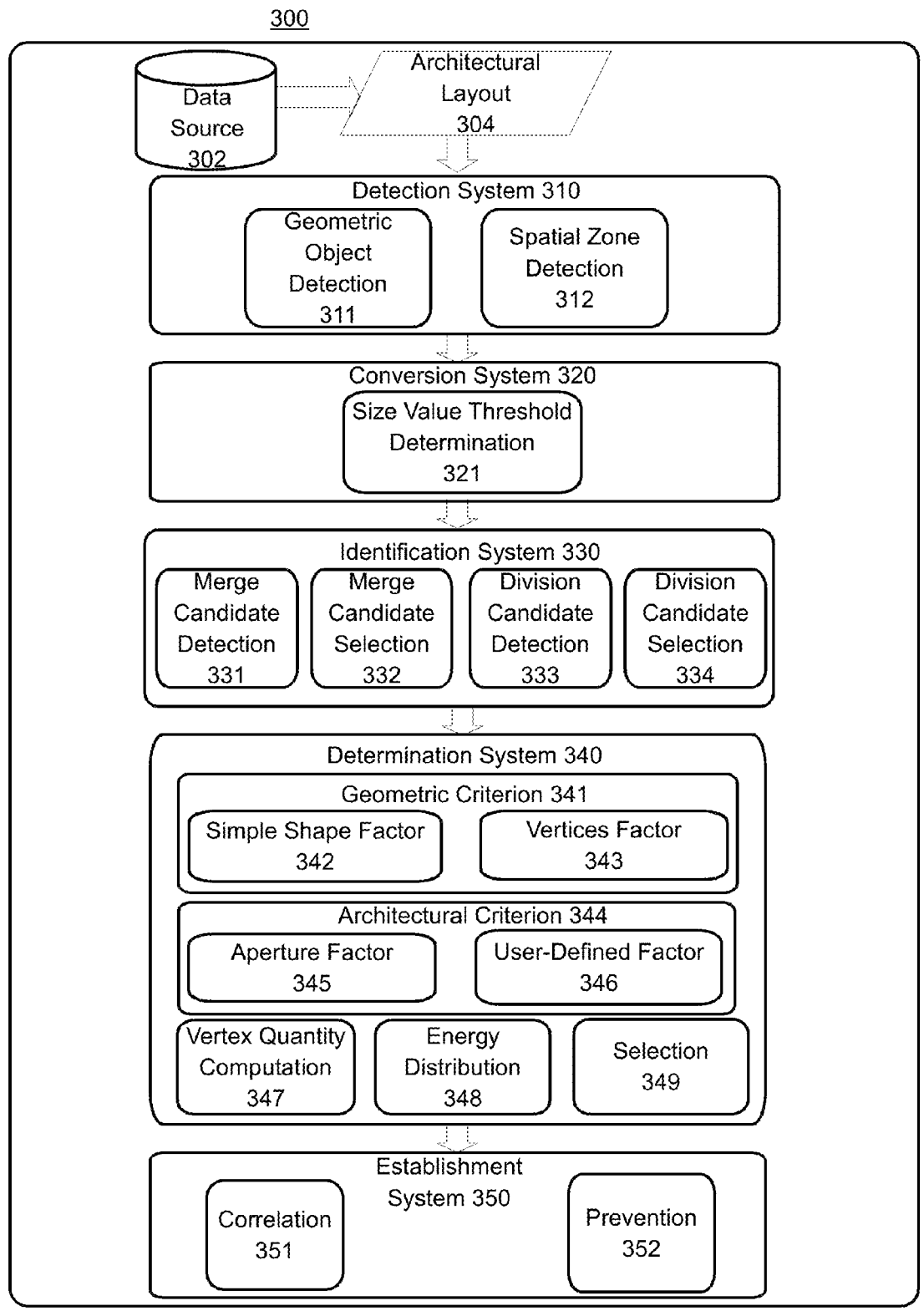
FIG. 3 is a block diagram illustrating a design-model management system according to embodiments.

FIG. 3 is a block diagram illustrating a design-model management system 300, consistent with various embodiments. The design-model management system 300 may include a number of sub-systems and modules configured to execute operations of a method for managing (a group of geometric objects correlated to) a set of spatial zones associated with an architectural layout. As shown in FIG. 3, the design-model management system 300 may include a data source 302, an architectural layout 304, a detection system 310, a conversion system 320, an identification system 330, a determination system 340, and an establishment system 350. Aspects of FIG. 3 may be similar or the same as other aspects described herein; for example, aspects related to FIG. 2. Other systems, modules, and operations in keeping with the scope and spirit of the disclosure are also possible.

The data source 302 may include electronic and non-electronic mediums including blueprints, floor plans, raw files, digital files (e.g., ACA files, image files, PDF files, scanned documents), aerial/satellite images, photographs, and other means of data storage. Put differently, the data source 302 may include the medium or means of conveying the architectural layout (e.g., digital file, hand-drawn blueprint), while the architectural layout may include the data (e.g., lines, shapes, symbols,) that make up the graphical representation of the building and its architecture. As described herein, the building may be modeled using include two-dimensional, three-dimensional, or other multi-dimensional objects, data structures, or images. Data sources other than those mentioned explicitly herein are also possible.

Generally, the architectural layout 304 may include a plan or design that depicts the structural arrangement and physical characteristics of a building. For instance, the architectural layout 304 may include a two-dimensional or three-dimensional diagram of the structural arrangement of a residential building (e.g., house), commercial building (e.g., office building, retail store), industrial building (e.g., factory) or other physical structures (arenas, parking ramps, swimming pools, space stations). The architectural layout 304 may be populated by symbols, markings, shapes, characters, text, or other elements that designate, annotate, or otherwise call out particular aspects which can represent, symbolize or indicate a set of architectural features of the building or structure. As examples, the architectural features may include doors, windows, walls, stairs, appliances, furnishings, and other physical characteristics of the building or structure.

The detection system 310 can include a geometric object detection module 311 to detect a first geometric object of a group of geometric objects. The detection system 310 can include a spatial zone detection module 312 to detect a first spatial zone of a set of spatial zones. In embodiments, the set of spatial zones may include two-dimensional, three-dimensional, or multi-dimensional regions, rooms, areas, or other portions of space of a building or other structure. Detecting can include sensing (e.g., computer recognition) or receiving (e.g., obtaining, acquiring, pulling, subscribing, opening).

In embodiments, the group of geometric objects may include polygons, shape outlines, and other two-dimensional or three-dimensional shapes and figures. More particularly, the group of geometric objects may include geometric shapes such as quadrilaterals, hexagons, points, lines, spheres, polyhedra, topological spaces, polytopes, manifolds, arcs, wireframes, planes, surfaces, faces, point-clouds, or other figures. In embodiments, the group of geometric objects may correspond to a set of spatial zones of an architectural layout. For instance, a particular geometric shape may correspond to a particular spatial zone of the architectural layout. In certain situations, one geometric shape may correspond to multiple spatial zones of the architectural layout. Similarly, in some instances multiple geometric shapes may correspond to a single spatial zone.

In embodiments, the first geometric object of the group of geometric objects may have a first geometric object size value. In embodiments, the first spatial zone may have a first spatial zone size value. The geometric object size value (or spatial zone size value) may be based on a numerical value that represents one or more quantifiable properties of the geometric object (or spatial zone size value). For example, the first geometric object size value (or first spatial zone size value) may indicate a length, area, perimeter, volume, surface area, diameter, or other characteristic of the first geometric object (or first spatial zone).

The conversion system 320 can include a size value threshold determination module 321 to determine to convert (e.g., merge, divide) the first geometric object (or the first spatial zone). The determination may be made by comparing the first geometric size value (or the first spatial zone size value) with a threshold geometric object size value (or threshold spatial zone size value). In embodiments, the threshold geometric object size value (or threshold spatial zone size value) may include a predetermined/user-defined size value such that geometric objects (or spatial zones) that achieve the threshold value may be considered sized-appropriately for conversion (e.g., merging or combining with other geometric objects or spatial zones). In various embodiments, the threshold size value can be user-defined (e.g., 12 square feet), or it may be calculated based on a building perimeter/area/volume (e.g., using a ratio, scaling, or proportion such as 20% of the longest-length), for example. In certain embodiments, conversion can include dividing a large room into a plurality of smaller rooms (potentially of the same or different shapes/sizes).

The identification system 330 can identify (for the first geometric object or for the first spatial zone) a group of conversion candidates (of the group of geometric objects or of the set of spatial zones). The group of conversion candidates (e.g., polytopes) may include a subgroup of the group of geometric objects or a subset of the set of spatial zones. In embodiments, the group of conversion candidates may be identified based on proximity (e.g., with respect to the first geometric object or the first spatial zone). Generally, proximity may include nearness or closeness. For instance, in embodiments the group of conversion candidates may include adjacency (e.g., sharing a border with, diagonal at a corner). In certain embodiments, the group of conversion candidates can include a second order adjacent candidate (e.g., adjacent to an adjacent candidate without sharing a border with the first geometric object or the first spatial zone). In embodiments, the group of conversion candidates can include a neighboring candidate (e.g., within a threshold range regardless of whether a touchpoint exists). For example, a closet may neighbor a bedroom even though another closet is in between. In various embodiments, the group of conversion candidates may be identified based on location within a threshold radius of the first geometric object. Other methods and operations for identifying the group of conversion candidates are also considered.

The identification system 330 may include a merge candidate detection module 331, a merge candidate selection module 332, a division candidate detection module 333, or a division candidate selection module 334. The merge candidate detection module 331 can detect merge candidates which may be adjacent/neighboring to the first geometric object or the first spatial zone. The merge candidate selection module 332 may select merge candidates which are sized-appropriately for a merge operation (e.g., other similarly sized or smaller objects/rooms, one larger object/room). The division candidate detection module 333 can detect division candidates such as long/narrow geometric objects or particular spatial zones (e.g., a length:width ratio of at least 2:1, or a specific type of room to apply energy distribution performance efficiencies such as a space having a hot-tub, an elliptical machine, and a home-theater). The division candidate selection module 334 may select a divisional approach which is appropriate for the features presented (e.g., halve the room, tailor the resultant geometric objects based on adjacent objects). Combinations of components of the modules are considered to be utilized across one or more modules.

The determination system 340 can include a geometric criterion module 341 or an architectural criterion module 344. The geometric criterion module 341 may have a simple shape factor module 342 or a vertices factor module 343. The architectural criterion module 344 may have an aperture factor module 345 or a user-defined factor module 346. Also, the determination system can include a vertex quantity computation module 347, an energy distribution module 348, or a selection module 349.

The geometric criterion module 341 uses a geometric criterion to determine a second geometric object based on the first geometric object and the group of conversion candidates. The second geometric object may be the resultant object after conversion. In embodiments, the second geometric object may be similar to the group of geometric objects (e.g., shape, polytope, cube). The second geometric object can be formed by conversion of the first geometric object and at least a portion of the group of conversion candidates. For example, the second geometric object may include a new polytope for a newly created room (e.g., for the purposes of energy distribution) that is not necessarily a real room in the architectural layout. Generally, the geometric criterion may include guidelines, conditions, principles, or other specifications that govern the determination of the second geometric object (e.g., using geometrical analytics, mathematical analytics, numerical analytics, shape analytics, data analytics). One or more of a variety of geometric criteria are possible.

In embodiments, the simple shape factor module 342 may use a simple shape factor which can include a specification, parameter, or directive that orients/inclines the creation of plain geometric objects (e.g., easily recognizable two-dimensional and three-dimensional forms such as rectangles, boxes, and the like). In certain embodiments, the simple shape factor may give preference to the combination of geometric objects so as to form straight-line, quadrilateral, or rectangular-like shapes. For example, a first example geometric object in a shape similar to the state of Utah (or Nevada) may be preferred relative to a second example geometric object in a shape similar to the state of New York (or Kentucky).

In embodiments, the vertices factor module 343 may use a vertices factor. The vertices factor may include a specification, parameter, or directive that orients/inclines the formation of geometric objects with a number of vertices below a threshold (e.g., fewer quantity of vertices). In general, candidate combinations with different shapes may be compared and then the candidate combination with fewest vertices can be selected. An algorithm may take the group of conversion candidates and the first geometric object and compute possible combinations of candidate second geometric objects. Subsequently, the vertices factor may be applied. For example, a shape similar to the state of Utah (six vertices) may be selected instead of a shape similar to the state of New York (twenty-five or more vertices). In various embodiments, the vertices factor may be a specification that chooses shapes with one or more vertex angles between a specified range (e.g., 90-110). Usage of arcs/curves/cones/spheres may be based on a user-defined parameter (e.g., no curves, treat curves like octagons).

The architectural criterion module 344 uses an architectural criterion to determine a second spatial zone based on the first spatial zone and the group of conversion candidates. The second spatial zone may be the resultant spatial zone after conversion. In embodiments, the second spatial zone may be similar to the set of spatial zones (e.g., room-like areas/volumes). The second spatial zone can be formed by conversion of the first spatial zone and at least a portion of the group of conversion candidates. Generally, the architectural criterion may include guidelines, conditions, principles, or other specifications that govern the determination of the second spatial zone (e.g., based on a component of the architectural layout).

In embodiments, the aperture factor module 345 can be utilized with respect to the architectural criterion. The aperture factor module 345 may include using one or more of: a room-type factor (e.g., closet, stairwell, shower), an elevation factor (ceiling/floor height, sunken room, sloped floor or ceiling), a closet factor (e.g., clothing closet, pantry, storage), doorway factor (e.g., entrance, exit, transition), stairwell (e.g., staircase, steps, stairway, laundry chute), or a window factor (e.g., casement, fixed/picture, awning, gliding, skylight). A scoring/weighting system may be used to choose which elements are better fits for conversion. For example, if the first spatial zone is a clothing closet, a storage closet may be a positive fit and score well with respect to being a conversion candidate. In various embodiments, aspects of the aperture factor module 345 may score as better fits for conversion than traditional rooms (e.g., kitchen). Altogether, the group of conversion candidates may be positively impacted using (e.g., or giving preference to) spaces such as closets, stairwells, etc.

In embodiments, the user-defined factor module 346 can be utilized with respect to the architectural criterion. The user-defined factor module 346 may impact an energy distribution efficiency. For example, the user-defined factor may include a rule, policy, or logic system that facilitates the distribution of energy/power throughout the building. To illustrate, the user-defined factor may include HVAC distribution, air distribution, radiant distribution (e.g., electric or fluid panels), hydronic distribution (e.g., baseboard heating using a liquid), and the like. In embodiments, the energy distribution efficiency may be utilized to determine the second spatial zone (e.g., utilizing a combination of components described herein such as the aperture factor module 345).

The vertex quantity computation module 347 can compare candidate second geometric objects that could be created, and then be weighted to select the one with the fewest vertices. As such, a first vertex quantity for a first proposed geometric object combination may be computer. Accordingly, a second vertex quantity for a second proposed geometric object combination can be computed. In response to the first vertex quantity exceeding the second vertex quantity, the second proposed geometric object combination may be selected. In embodiments, weighting may occur to break ties with respect to other factors. In certain embodiments, the weighting may override scoring when aspects are not tied but close enough (e.g., within a threshold).

The energy distribution module 348 can compare proposed spatial zones that could be generated, and then be weighted to select the one with a positive impact on energy distribution. As such, a first energy distribution efficiency for a first proposed spatial zone combination may be computed. Accordingly, a second energy distribution efficiency for a second proposed spatial zone combination can be computer. Based on a comparison of the first energy distribution efficiency with the second energy distribution efficiency, the second proposed spatial zone combination may be selected (e.g., more positive impact on energy distribution). In embodiments, weighting may occur to break ties with respect to other factors. In certain embodiments, the weighting may override scoring when aspects are not tied but close enough (e.g., within a threshold).

The selection module 349 can be utilized in determining the second geometric object or the second spatial zone. The selection module 349 can use various scoring or weighting methodologies to leverage a selection to have a positive impact. The selection can utilize user-defined specifications or parameters (e.g., no objects smaller than 10, merge all closets). As such, aspects described herein may be scored (e.g., 0 to 100) and weighted (e.g., 1× to 10×). Thereafter, results may be ranked, sorted, or distributed. Generally, a value exceeding a benchmark may be utilized. Accordingly, a best fit may be ascertained and implemented using the specifications, parameters, or directives. In certain embodiments, a user may be provided with a presentation and an opportunity to make a choice via a graphical user interface.

The establishment system 350 can establish a design-model of the architectural layout using the second geometric object or the second spatial zone. For example, the design-model may include one or more polytopes whose formation is based on the group of geometric objects. The design-model can include a virtual model. In certain embodiments, the design-model includes a heating, ventilation, and air conditioning (HVAC) design-model for an HVAC system proposed to be constructed in the building. In various embodiments, elements of the design-model may be based on HVAC apparatus size. The correlation module 351 of the establishment system 350 can correlate a (second) geometric object to a second spatial zone associated with the architectural layout (e.g., correlate a rectangle to a room).

The prevention module 352 of the establishment system 350 can prevent, based on a profile, certain geometric objects or spatial zones from being converted (e.g., merged, divided). As such, the second geometric object may be prevented from being based on at least a portion of the group of geometric objects based on a geometric object profile. Accordingly, the second spatial zone may be prevented from being based on at least a portion of the set of spatial zones based on a spatial zone profile. The profile may be a textual, arithmetic, or graphical summary/identifier of characteristics or properties of a particular geometric object or spatial zone. For example, the profile may include information regarding the size, location, elevation, intended uses, and other information. In embodiments, the profile may be used to identify or disqualify conversion candidates. Altogether, aspects of the design-model management system 300 can include performance or efficiency benefits for managing (a group of geometric objects correlated to) a set of spatial zones associated with an architectural layout.

Figure 4:
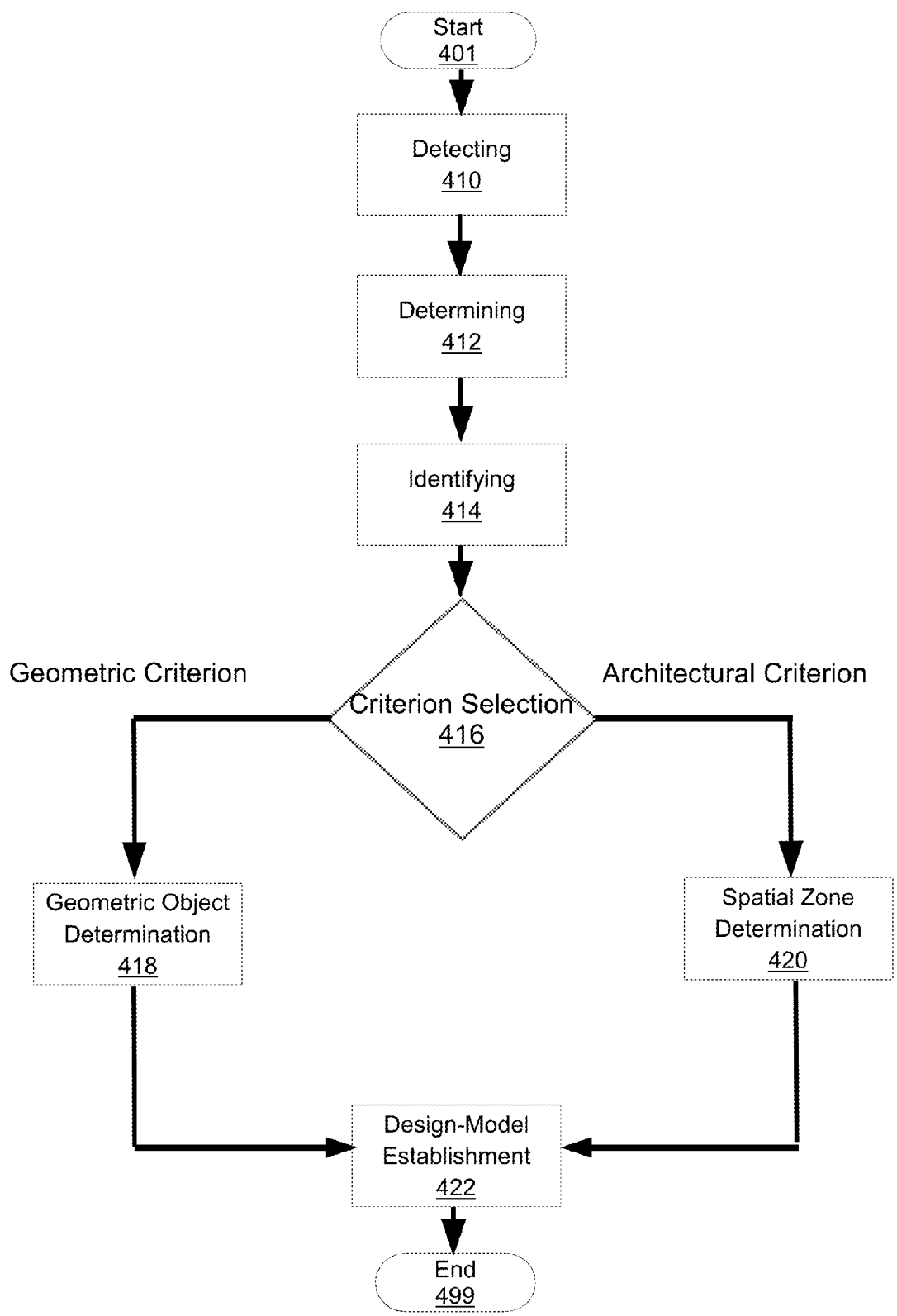
FIG. 4 is a flowchart illustrating a method for managing (a group of geometric objects correlated to) a set of spatial zones associated with an architectural layout according to embodiments.

FIG. 4 is a flowchart illustrating a method 400 for managing (a group of geometric objects correlated to) a set of spatial zones associated with an architectural layout according to embodiments. Aspects of method 400 may be similar, the same, or consistent with the description in FIG. 2 or FIG. 3. Method 400 may begin at block 401. At block 410, detection of the first geometric object or the first spatial zone occurs. At block 412, a conversion determination is made for the first geometric object or the first spatial zone. At block 414, identification of the group of conversion candidates occurs based on proximity. Proximity can include a buffer region (e.g., to denote regions of impact with respect to the first geometric object or the first spatial zone).

At block 416, a criterion selection may be made (e.g., by a user). In embodiments, a geometric criterion can be selected when geometric objects arising out of the architectural layout mismatch outside of a threshold tolerance level with respect to rooms of the architectural layout (e.g., a large number of geometric objects purporting to be rooms with respect to the actual number of rooms—such as more than 10%). In embodiments, an architectural criterion can be selected when spatial zones arising out of the architectural layout match within a threshold tolerance level with respect to rooms of the architectural layout (e.g., spatial zones with respect to rooms is within 10% accurate). In various embodiments, the criterion selection may be made randomly. In certain embodiments, candidate outputs to using each criterion may be presented to a user that can choose or compared with a corpus of previously chosen/selected outputs (e.g., using machine learning techniques).

At block 418, the second geometric object can be determined using the geometric criterion (e.g., simple shape factor, vertices factor). At block 420, the second spatial zone can be determined using the architectural criterion (e.g., aperture factor, user-defined factor). In various embodiments, it is contemplated to use both the geometric criterion and the architectural criterion. At block 422, the design-model is established with respect to the architectural layout. Method 400 concludes at block 499. Aspects of method 400 may provide performance or efficiency benefits by saving resources or having a positive impact with respect to administrative burdens.

For instance, the threshold size factor may be a specification, criterion or guideline that quantitatively or qualitatively designates a preferable size for the set of spatial zones. In embodiments, the threshold size factor may be expressed in relative terms as a ratio or percentage of the total area (e.g., or volume) of the architectural layout. The threshold size factor may also be expressed in absolute terms as a specified area or volume value. In embodiments, the threshold size factor may be determined by a user (e.g., the user may specify a desirable size range for the spatial zones). In embodiments, the threshold size factor may include an upper boundary and a lower boundary, such that spatial zones that fall within the range may be considered to be of satisfactory size, spatial zones that fail to achieve the lower boundary may be considered candidates for merge, and spatial zones that exceed the upper boundary may be considered candidates for division. In certain embodiments, the threshold size factor may be computed based on the size or scope of the architectural layout. For example, the upper boundary may be determined to a ratio or portion of the entire area or volume of the architectural layout (e.g., ⅕ the size of the total area) and the lower boundary may be expressed as a ratio of the largest spatial zone (e.g., ¼ the size of the largest spatial zone.) Other methods of determining the threshold size factor are also possible.

Consider the following example. An architectural layout for a home may be composed of 10 individual spatial zones, comprising 22% (e.g., first floor living room), 15% (basement living room), 14% (kitchen), 11% (master bedroom), 10% (dining room), 7% (first bedroom), 7% (second bedroom), 6% (study), 5% (master bathroom), 3% (secondary bathroom) of the total area of the architectural layout, respectively. As described herein, the threshold size factor may have an upper boundary of 20% and a lower boundary of 6%. Accordingly, the first floor living room may be identified as a candidate for division (e.g., it exceeds the upper boundary of the threshold size factor), and the master bathroom and secondary bathroom as candidates for merge (e.g., they fail to achieve the lower boundary of the threshold size factor).

Division and merging of the spatial zones may be executed in one of a number of ways. In embodiments, spatial zones that exceed the upper boundary of the threshold size factor may be divided evenly into two or more spatial zones based on position (e.g., "north half," and "south half"). In embodiments, division of a spatial zone may be based on the utility or purpose of one or more portions of the spatial zone (e.g., "TV Area," and "Billiard Area.") In certain embodiments, a portion of a spatial zone that exceeds the upper boundary may be subtracted and added to a nearby spatial zone. Merging the spatial zones may also be based on position or utility/purpose. For instance, referring to the example above, the master bathroom may be merged with the adjacent master bedroom to create a single, larger spatial zone. Other methods of converting the spatial zones are also possible.

Figure 5:
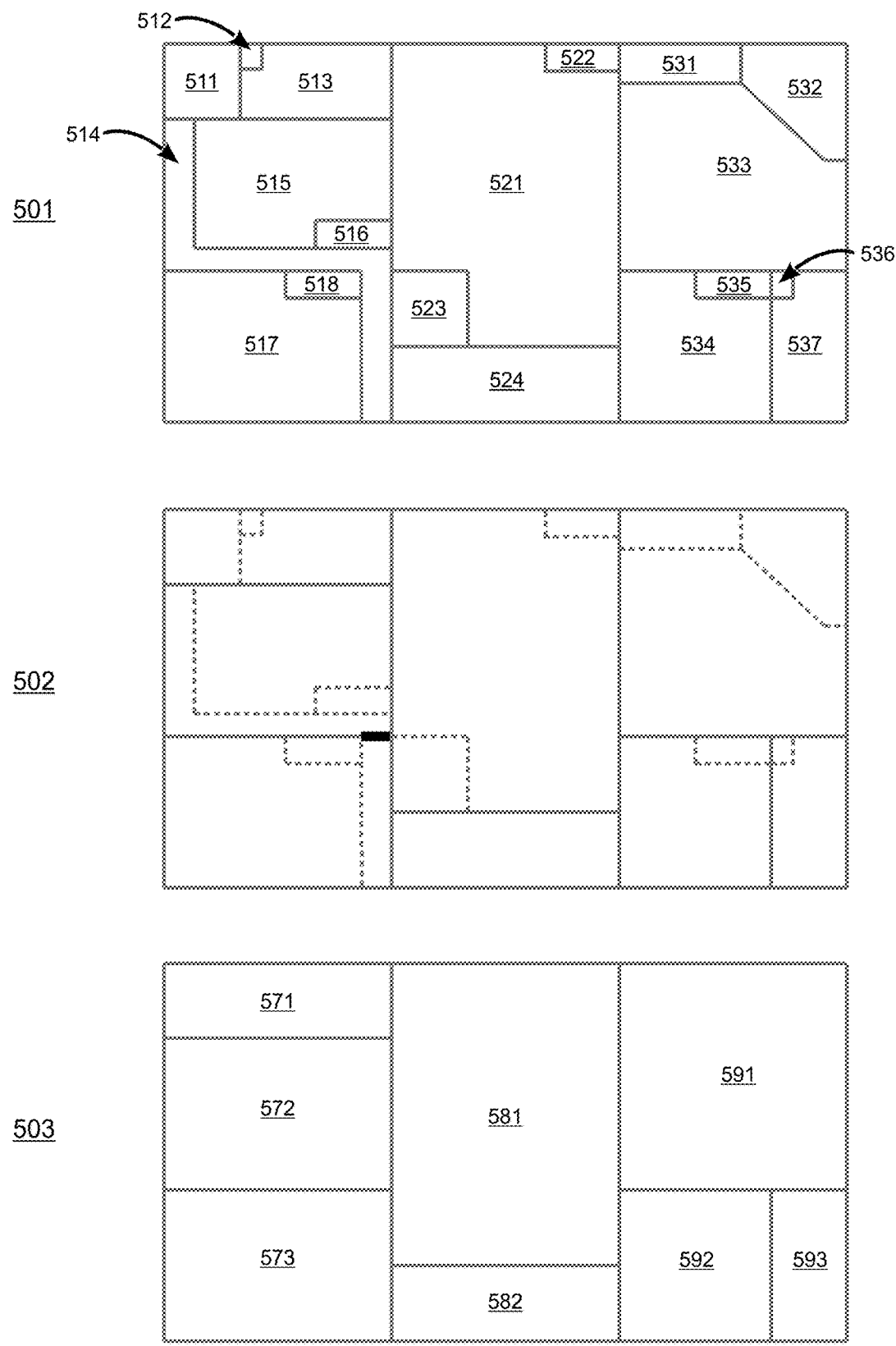
FIG. 5 depicts an example group of geometric objects correlated to an example set of spatial zones associated with an example architectural layout of a building according to embodiments.

FIG. 5 depicts an example group of geometric objects correlated to an example set of spatial zones associated with an example architectural layout of a building according to embodiments. FIG. 5 includes a first phase 501 (e.g., pre-management), a second phase 502 (e.g., management alterations), and a third phase 503 (e.g., post-management). The example group of geometric objects are depicted in the first phase 501 as individual polygons 511, 512, 513, 514, 515, 516, 517, 518, 521, 522, 523, 524, 531, 532, 533, 534, 535, 536, 537 which each has a size value (e.g., area values). Individual polygons below a threshold size value (511, 512, 514, 516, 518, 522, 523, 531, 532, 535, 536) may be determined to be converted (merged or divided).

Based on proximity, a group of conversion candidates is identified for the individual polygon. The group of conversion candidates may include geometric objects below the threshold size value, at the threshold size value, or above the threshold size value (in embodiments, one of these categories may be considered or more than one category). Embodiments may have a conversion candidate threshold size value in order to be considered. The second phase 502 shows new geometric objects having been determined using a geometric criterion. FIG. 5 (or aspects of FIG. 6) can show how a simple shape factor or a vertices factor (described herein) may be utilized. The third phase 503 shows the newly determined geometric objects and may depict aspects of an established design-model. The third phase 503 depicts geometric objects 571, 572, 573, 581, 582, 591, 592, 593 which may correlate to the set of spatial zones associated with the architectural layout. As such, performance or efficiency benefits may result with respect to energy distribution (e.g., by factoring-in the design using geometric objects with respect to the geometric criterion).

Figure 6:
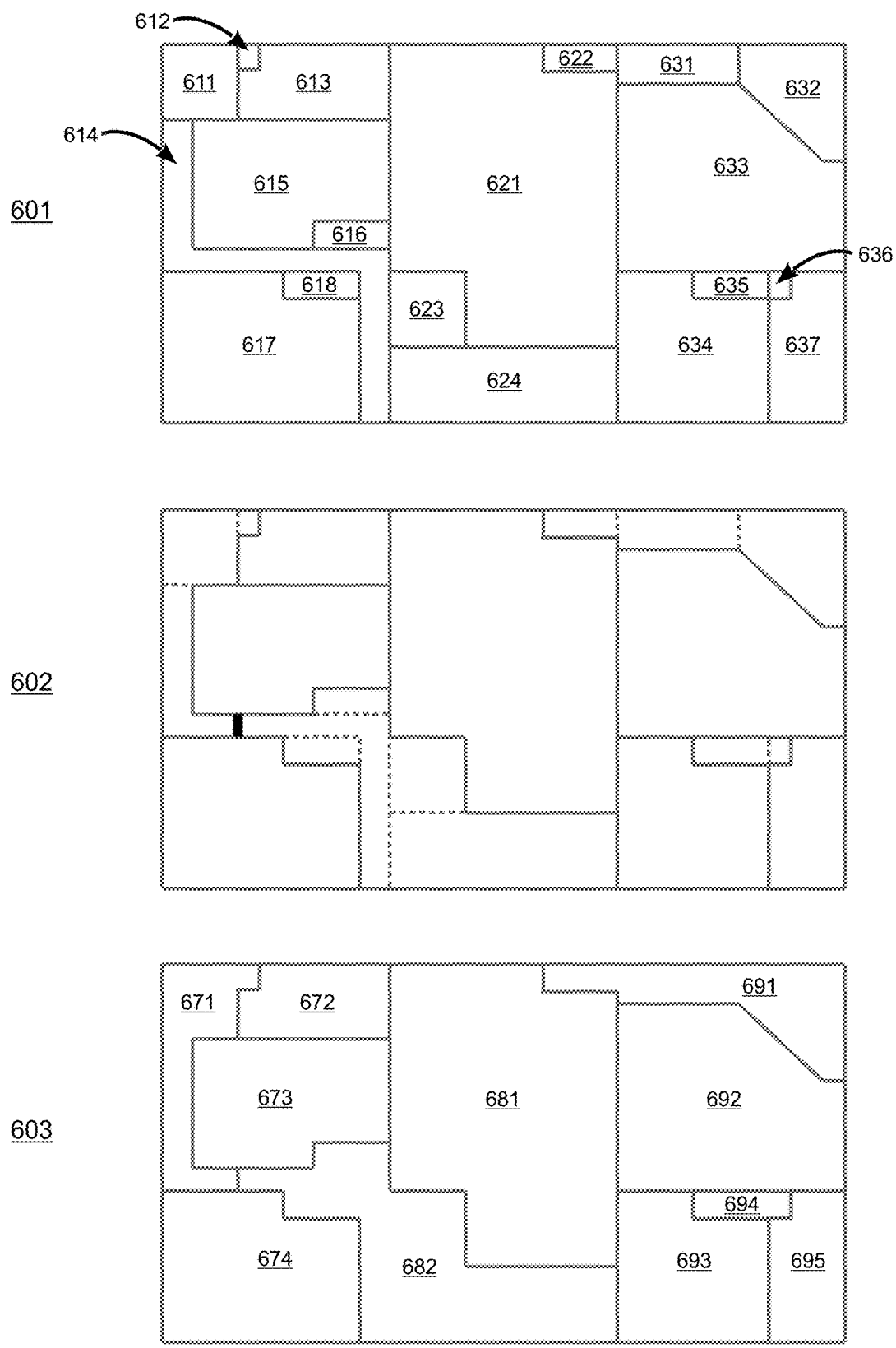
FIG. 6 depicts an example set of spatial zones associated with an example architectural layout of a building according to embodiments.

FIG. 6 depicts an example set of spatial zones associated with an example architectural layout of a building according to embodiments. (In various embodiments, FIG. 5 and FIG. 6 may be used interchangeably with respect to using a geometric criterion or using an architectural criterion). FIG. 6 includes a first phase 601 (e.g., pre-management), a second phase 602 (e.g., management alterations), and a third phase 603 (e.g., post-management). The example set of spatial zones are depicted in the first phase 601 as individual zones 611 (e.g., storage room), 612 (e.g., bathroom closet), 613 (e.g., bathroom), 614 (e.g., hallway), 615 (e.g., bedroom/office), 616 (e.g., closet), 617 (e.g., bedroom), 618 (e.g., closet), 621 (e.g., living room), 622 (e.g., coat closet), 623 (e.g., display area or built-in entertainment area), 624 (e.g., stairway/overlook), 631 (e.g., kitchen pantry/appliances), 632 (e.g., kitchen appliances/countertop), 633 (e.g., kitchen), 634 (e.g., office/bedroom/dining room), 635 (e.g., closet/kitchen pantry), 636 (e.g., bathroom closet), 637 (e.g., bathroom) which each has a size value. Individual zones below a threshold size value (611, 612, 614, 616, 618, 622, 623, 631, 632, 635, 636) may be determined to be converted (merged or divided). In certain embodiments, not all of the individual zones below the threshold size value may end up actually being converted.

Based on proximity, a group of conversion candidates is identified for the individual zones. The group of conversion candidates may include spatial zones below the threshold size value, at the threshold size value, or above the threshold size value (in embodiments, one of these categories may be considered or more than one category). Embodiments may have a conversion candidate threshold size value in order to be considered. The second phase 602 shows new spatial zones having been determined using an architectural criterion. FIG. 6 (or aspects of FIG. 5) can show how an aperture factor or a user-defined factor (described herein) may be utilized. The third phase 603 shows the newly determined spatial zones and may depict aspects of an established design-model. The third phase 603 depicts spatial zones 671, 672, 673, 674, 681, 682, 691, 692, 693, 694, 695 which may correlate to the set of spatial zones associated with the architectural layout. As such, performance or efficiency benefits may result with respect to energy distribution (e.g., by factoring-in how spatial zones are designed to be utilized with respect to the architectural criterion).

Figure 7:
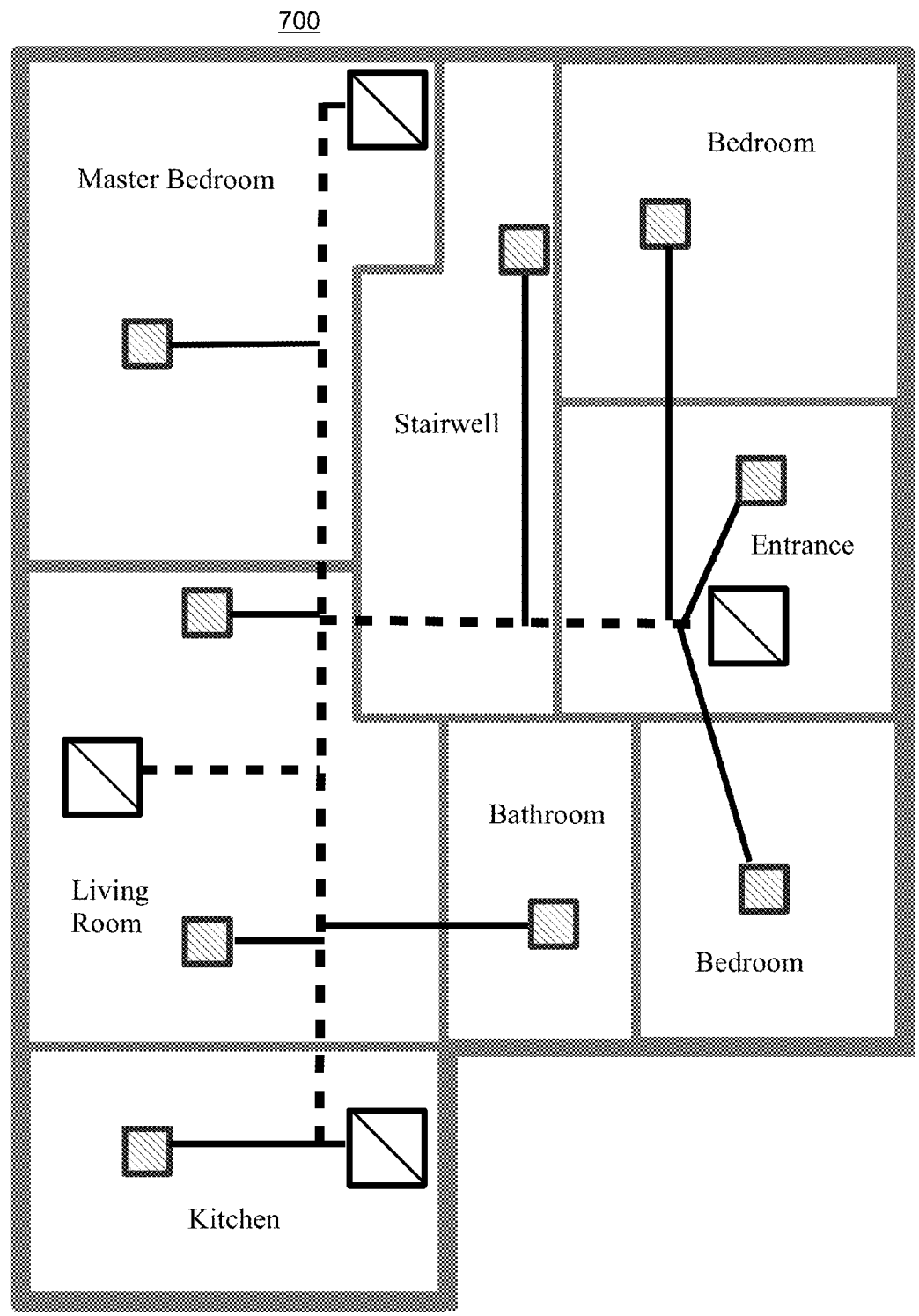
FIG. 7 depicts an example architectural layout of a building, according to embodiments.

FIG. 7 depicts an example architectural layout 700 of a building, consistent with embodiments. The example architectural layout may include an example design-model for the building. As described herein, establishing the design-model may include generating a thermal-system design to manage the thermal load of the building. Accordingly, the example design-model may include an example thermal system infrastructure of heating, ventilation, cooling and air conditioning equipment designed to manage the thermal load of the building. In certain embodiments, establishing the design-model may be based in part on an exterior wall architectural object. The exterior wall architectural object may be included in the set of architectural objects, and may represent at least a portion of an exterior wall of the architectural layout. Generally, the exterior wall architectural object may include a wall or vertical structure having at least one surface that is outside of the building. The exterior wall architectural object may be associated with a set of exterior wall data that indicates properties such as the insulation characteristics, thickness, structural attributes, degree of flammability, degree of permeability (e.g., to air, water) and the like. In embodiments, the exterior wall data may be used to generate the thermal-system design and establish the design-model for the architectural layout.

Figure 8:
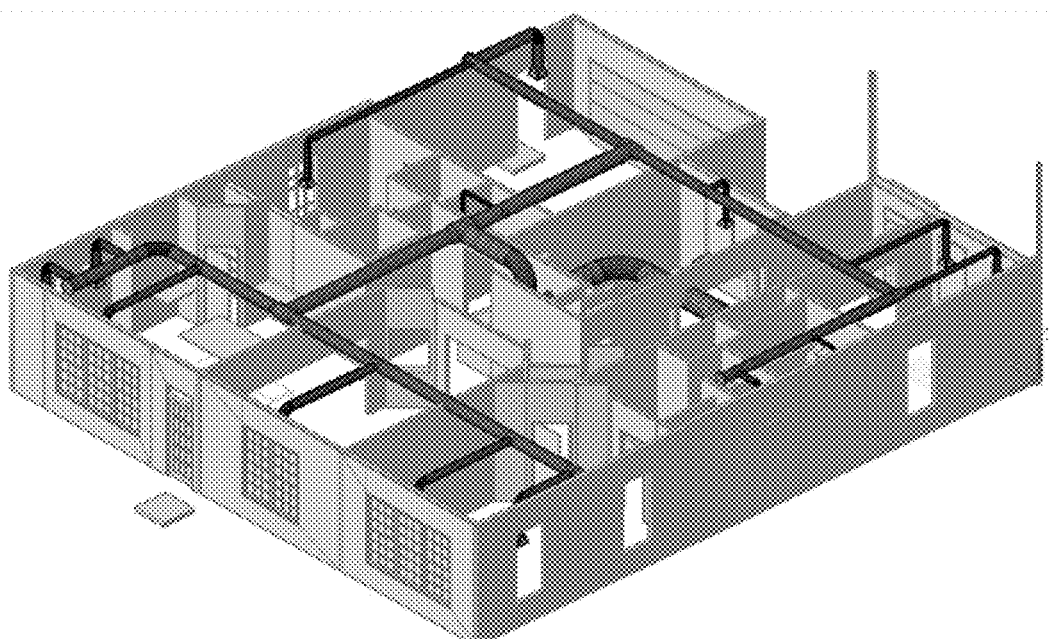
FIG. 8 depicts an example three-dimensional design-model, according to embodiments.

FIG. 8 depicts an example three-dimensional design-model 800, consistent with embodiments. As described herein, establishing the design-model may include generating a thermal-system design to manage the thermal load of the building. Accordingly, the design-model 800 includes an example thermal system infrastructure of heating, ventilation, cooling and air conditioning equipment (e.g., duct system objects) designed to manage the thermal load of the building. FIG. 8 may depict the design-model 800 in a first view, displaying the thermal-system infrastructure and surrounding structural components.

Figure 9:
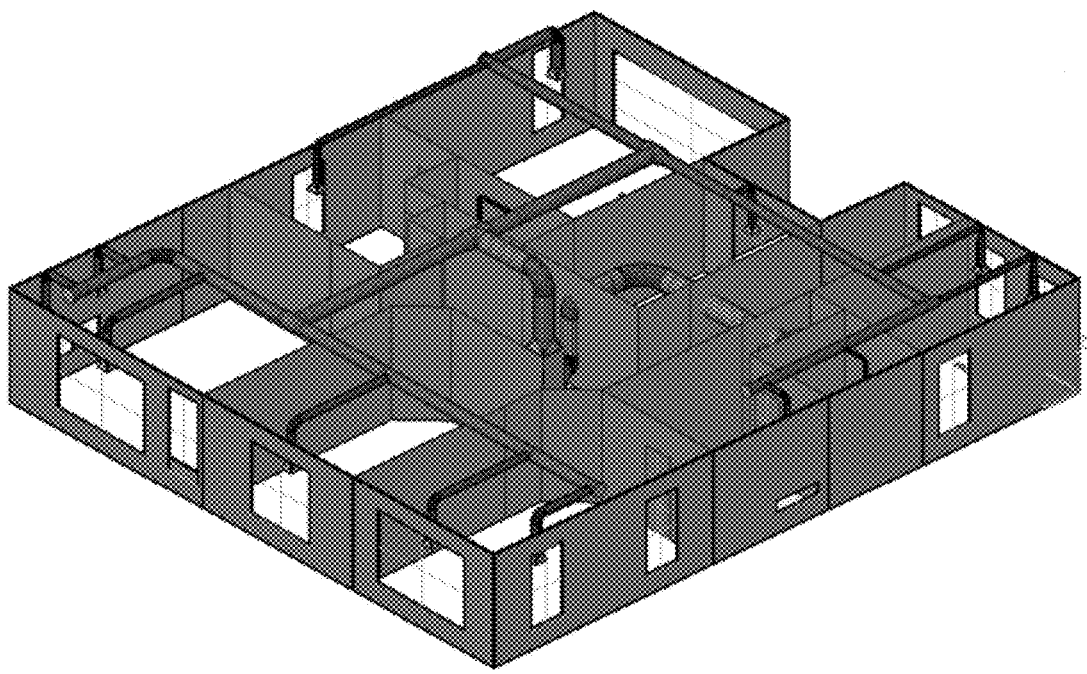
FIG. 9 depicts an example three-dimensional design-model, according to embodiments.

FIG. 9 depicts an example three-dimensional design model 900, consistent with embodiments. FIG. 9 may depict the design model 900 in a second view, displaying the thermal-system infrastructure, surrounding structural components, and architectural objects (e.g., rooms, windows, and doors) of the building. The thermal-system design may be used to model the heat flow and energy distribution of the building. Other thermal-design systems and methods of managing heat flow and energy distribution are also possible.

Figure 10:
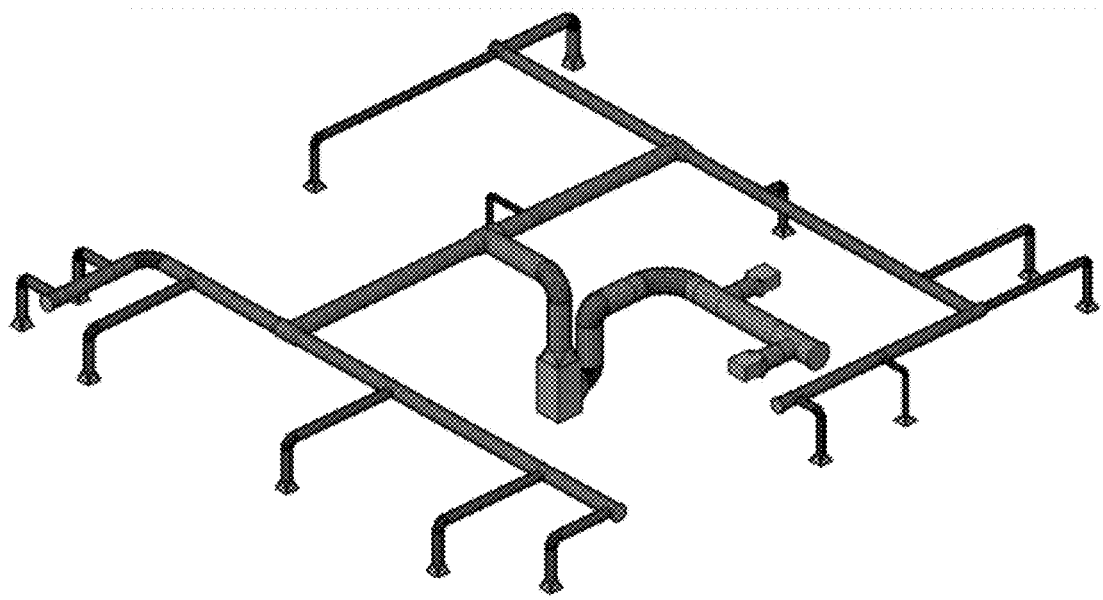
FIG. 10 depicts an example thermal-system design, according to embodiments.

FIG. 10 depicts an example thermal-system design 1000, consistent with embodiments. The thermal-system design 1000 may have an isolated view of the duct system objects and other heating, ventilation, cooling, and air conditioning equipment used in the first view of the three-dimensional design model 800 and the second view of the three-dimensional design model 900.

In addition to embodiments described above, other embodiments having fewer operational steps, more operational steps, or different operational steps are contemplated. Also, some embodiments may perform some or all of the above operational steps in a different order. The modules are listed and described illustratively according to an embodiment and are not meant to indicate necessity of a particular module or exclusivity of other potential modules (or functions/purposes as applied to a specific module).

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Embodiments according to this disclosure may be provided to end-users through a cloud-computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud-computing resources are provided to a user on a pay-per-use basis, where users are charged only for the computing resources actually used (e.g., an amount of storage space used by a user or a number of virtualized systems instantiated by the user). A user can access any of the resources that reside in the cloud at any time, and from anywhere across the Internet. In context of the present disclosure, a user may access applications or related data available in the cloud. For example, the nodes used to create a stream computing application may be virtual machines hosted by a cloud service provider. Doing so allows a user to access this information from any computing system attached to a network connected to the cloud (e.g., the Internet).

Embodiments of the present disclosure may also be delivered as part of a service engagement with a client corporation, nonprofit organization, government entity, internal organizational structure, or the like. These embodiments may include configuring a computer system to perform, and deploying software, hardware, and web services that implement, some or all of the methods described herein. These embodiments may also include analyzing the client's operations, creating recommendations responsive to the analysis, building systems that implement portions of the recommendations, integrating the systems into existing processes and infrastructure, metering use of the systems, allocating expenses to users of the systems, and billing for use of the systems.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to exemplary embodiments, other and further embodiments of the invention may be devised without departing from the basic scope thereof, and the scope thereof is determined by the claims that follow. The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A computer-implemented method comprising:
    correlating a group of geometric objects to a set of spatial zones associated with an architectural layout, wherein at least one of the set of spatial zones includes a set of polytopes or the group of geometric objects includes a group of polytopes;
    executing, by a design-model management application of a host device, a detection operation to detect a first geometric object of the group of geometric objects, wherein the first geometric object has a first geometric object size value;
    executing, by the design-model management application of the host device, a conversion operation to convert the first geometric object by comparing the first geometric object size value with a threshold geometric object size value;
    executing, by the design-model management application of the host device, an identification operation to identify for the first geometric object, based on proximity, a group of conversion candidates of the group of geometric objects;
    executing, by the design-model management application of the host device, a determination operation to determine a second geometric object using a geometric criterion based on the first geometric object and the group of conversion candidates; and,
    executing, by the design-model management application of the host device, an establishment operation to establish a design-model of the architectural layout using the second geometric object.

2. The method of claim 1, wherein the geometric criterion uses a simple shape factor.

3. The method of claim 1, wherein the geometric criterion uses a vertices factor for the second geometric object.

4. The method of claim 1, wherein determining the second geometric object using the geometric criterion includes:
    computing a first vertex quantity for a first proposed geometric object combination;
    computing a second vertex quantity for a second proposed geometric object combination; and
    selecting, in response to the first vertex quantity exceeding the second vertex quantity, the second proposed geometric object combination.

5. The method of claim 1, wherein identifying for the first geometric object, based on proximity, a group of conversion candidates of the group of geometric objects includes:
   detecting a first conversion candidate adjoins the first geometric object;
   detecting a second conversion candidate neighbors the first geometric object; and
   selecting both the first conversion candidate and the second conversion candidate for the group of conversion candidates.

6. The method of claim 1, wherein establishing, using the second geometric object, the design-model of the architectural layout includes:
   correlating the second geometric object to a second spatial zone associated with the architectural layout.

7. The method of claim 1, further comprising preventing, based on a geometric object profile, the second geometric object from being based on at least a portion of the group of geometric objects.

8. The method of claim 1, wherein the threshold geometric object size value is based on at least one of a group consisting of the architectural layout, the group of geometric objects, or a user-defined value.

9. The method of claim 1, wherein determining to convert the first geometric object includes determining that the first geometric object size value is less than the threshold geometric object size value, and wherein the group of conversion candidates includes a group of merge candidates.

10. The method of claim 1, wherein determining to convert the first geometric object includes determining that the first geometric object size value is greater than the threshold geometric object size value, and wherein the group of conversion candidates includes a group of division candidates.

11. The method of claim 1, wherein the design-model includes a heating, ventilation, and air conditioning (HVAC) design-model.

12. The method of claim 1, further comprising:
   metering use of the management of the group of geometric objects correlated to the set of spatial zones associated with the architectural layout; and
   generating an invoice based on the metered use.

13. A system comprising:
   a memory having a set of computer readable computer instructions, and
   a processor of a host device for executing the set of computer readable instructions, the set of computer readable instructions of a design-model management application including:
      correlating a group of geometric objects to a set of spatial zones associated with an architectural layout, wherein at least one of the set of spatial zones includes a set of polytopes or the group of geometric objects includes a group of polytopes;
      executing, by the design-model management application of the host device, a detection operation to detect a first geometric object of the group of geometric objects, wherein the first geometric object has a first geometric object size value;
      executing, by the design-model management application of the host device, a conversion operation to convert the first geometric object by comparing the first geometric object size value with a threshold geometric object size value;
      executing, by the design-model management application of the host device, an identification operation to identify for the first geometric object, based on proximity, a group of conversion candidates of the group of geometric objects;
      executing, by the design-model management application of the host device, a determination operation to determine a second geometric object using a geometric criterion based on the first geometric object and the group of conversion candidates; and
      executing, by the design-model management application of the host device, an establishment operation to establish a design-model of the architectural layout using the second geometric object.

14. The system of claim 13, wherein the geometric criterion uses a simple shape factor.

15. The system of claim 13, wherein the geometric criterion uses a vertices factor for the second geometric object.

16. The system of claim 13, wherein determining the second geometric object using the geometric criterion includes:
   computing a first vertex quantity for a first proposed geometric object combination;
   computing a second vertex quantity for a second proposed geometric object combination; and
   selecting, in response to the first vertex quantity exceeding the second vertex quantity, the second proposed geometric object combination.

17. A computer program product comprising a computer readable storage medium having program instructions embodied therewith, wherein the computer readable storage medium is not a transitory signal per se, the program instructions executable by a processor to cause the processor to perform a method comprising:
   correlating a group of geometric objects to a set of spatial zones associated with an architectural layout, wherein at least one of the set of spatial zones includes a set of polytopes or the group of geometric objects includes a group of polytopes;
   executing, by a design-model management application of a host device, a detection operation to detect a first geometric object of the group of geometric objects, wherein the first geometric object has a first geometric object size value;
   executing, by the design-model management application of the host device, a conversion operation to convert the first geometric object by comparing the first geometric object size value with a threshold geometric object size value;
   executing, by the design-model management application of the host device, an identification operation to identify for the first geometric object, based on proximity, a group of conversion candidates of the group of geometric objects;
   executing, by the design-model management application of the host device, a determination operation to determine a second geometric object using a geometric criterion based on the first geometric object and the group of conversion candidates; and
   executing, by the design-model management application of the host device, an establishment operation to establish a design-model of the architectural layout using the second geometric object.

18. The computer program product of claim 17, wherein the program instructions are stored in the computer readable storage medium in a data processing system, and wherein the program instructions were downloaded over a network from a remote data processing system.

19. The computer program product of claim 17, wherein the program instructions are stored in the computer readable storage medium in a server data processing system, and wherein the program instructions are downloaded over a network to the remote data processing system for use in a second computer readable storage medium with the remote data processing system.

\* \* \* \* \*